United States Patent
Tanifuji et al.

(10) Patent No.: US 9,266,180 B2
(45) Date of Patent: Feb. 23, 2016

(54) ARC EVAPORATION SOURCE HAVING FAST FILM-FORMING SPEED, COATING FILM MANUFACTURING METHOD AND FILM FORMATION APPARATUS USING THE ARC EVAPORATION SOURCE

(75) Inventors: Shinichi Tanifuji, Kobe (JP); Kenji Yamamoto, Kobe (JP); Homare Nomura, Takasago (JP); Yoshinori Kurokawa, Takasago (JP); Naoyuki Goto, Takasago (JP)

(73) Assignee: Kobe Steel, Ltd., Hyogo (JP)

( * ) Notice: Subject to any disclaimer, the term of this patent is extended or adjusted under 35 U.S.C. 154(b) by 476 days.

(21) Appl. No.: 13/805,259

(22) PCT Filed: Jun. 15, 2011

(86) PCT No.: PCT/JP2011/003403
§ 371 (c)(1),
(2), (4) Date: Dec. 18, 2012

(87) PCT Pub. No.: WO2011/161903
PCT Pub. Date: Dec. 29, 2011

(65) Prior Publication Data
US 2013/0098881 A1 Apr. 25, 2013

(30) Foreign Application Priority Data

Jun. 23, 2010 (JP) .................................. 2010-142614
Sep. 9, 2010 (JP) .................................. 2010-201946

(51) Int. Cl.
*B23K 9/00* (2006.01)
*C23C 14/32* (2006.01)
(Continued)

(52) U.S. Cl.
CPC .................. *B23K 9/00* (2013.01); *C23C 14/325* (2013.01); *H01J 37/32055* (2013.01); *H01J 37/3402* (2013.01)

(58) Field of Classification Search
CPC ............ B23K 9/00; B23K 9/08; B23K 9/073; B23K 9/0737; C23C 14/325; H01J 37/32055; H01J 37/3402
USPC .......................... 219/121.11, 121.43, 121.36; 204/192.38, 298.41, 298.2, 298.17, 204/298.19
See application file for complete search history.

(56) References Cited

U.S. PATENT DOCUMENTS 4,891,560 A * 1/1990 Okumura et al. ........ 315/111.41
5,160,595 A * 11/1992 Hauzer et al. ............ 204/192.38
(Continued)

FOREIGN PATENT DOCUMENTS

CN 101689468 A2 3/2010
JP 62-0207863 A 9/1987
(Continued)

OTHER PUBLICATIONS

International Search Report issued from the International Bureau in the corresponding International Application No. PCT/JP2011/003403, mailed Jul. 19, 2011, 2 pages.

*Primary Examiner* — Mark Paschall
(74) *Attorney, Agent, or Firm* — Studebaker & Brackett PC

(57) ABSTRACT

An arc evaporation source having fast film-forming speed includes: at least one circumference magnet surrounding the circumference of a target, wherein the magnetization direction of the magnet runs orthogonal to the target surface; a non-ring shaped first permanent magnet on the target's rear surface side has a polarity in the same direction as the circumference magnet, and is arranged so that its magnetization direction runs orthogonal to the target's surface; a non-ring shaped second permanent magnet arranged either on the rear surface side of the first permanent magnet or between the first permanent magnet and the target, so as to leave a gap from the first permanent magnet, has a polarity in the same direction as the circumference magnet, and is arranged so that its magnetization direction runs orthogonal to the surface of the target; and a magnetic body between the first permanent magnet and the second permanent magnet.

20 Claims, 12 Drawing Sheets

(51) Int. Cl.
*H01J 37/32* (2006.01)
*H01J 37/34* (2006.01)

(56) References Cited

U.S. PATENT DOCUMENTS

| | | | |
|---|---|---|---|
| 6,334,405 B1 | 1/2002 | Takahara et al. | |
| 6,440,282 B1* | 8/2002 | Wada et al. | 204/298.2 |
| 2004/0112736 A1* | 6/2004 | Larrinaga | 204/192.38 |
| 2006/0237309 A1 | 10/2006 | Goikoetxea Larrinaga | |
| 2010/0083901 A1* | 4/2010 | Meyer | 118/723 E |
| 2010/0213055 A1* | 8/2010 | Vetter | 204/298.41 |

FOREIGN PATENT DOCUMENTS

| | | |
|---|---|---|
| JP | 63-446 | 1/1988 |
| JP | 63-000446 U | 1/1988 |
| JP | 07-180043 A | 7/1995 |
| JP | 2000-0328236 A | 11/2000 |
| JP | 2004-0523658 | 8/2004 |
| JP | 2004-523658 A | 8/2004 |
| JP | 2006-0249527 A | 9/2006 |
| JP | 2007-056347 A | 3/2007 |
| JP | 2009-144236 A | 7/2009 |
| KR | 2010-0015634 A | 2/2010 |

* cited by examiner

FIG.1
(a)
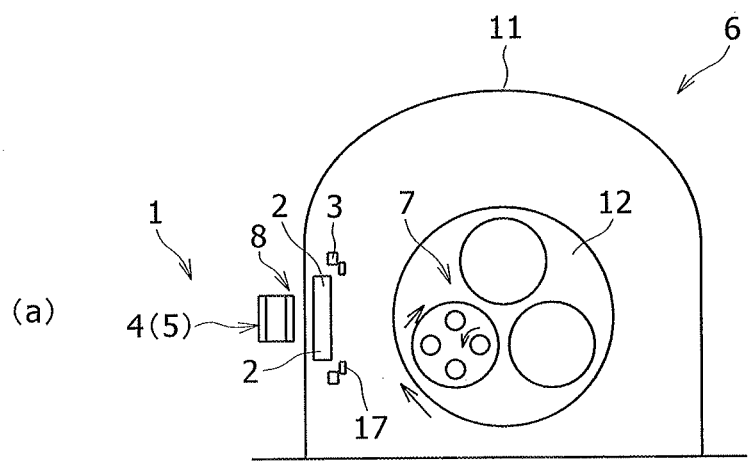
(b)
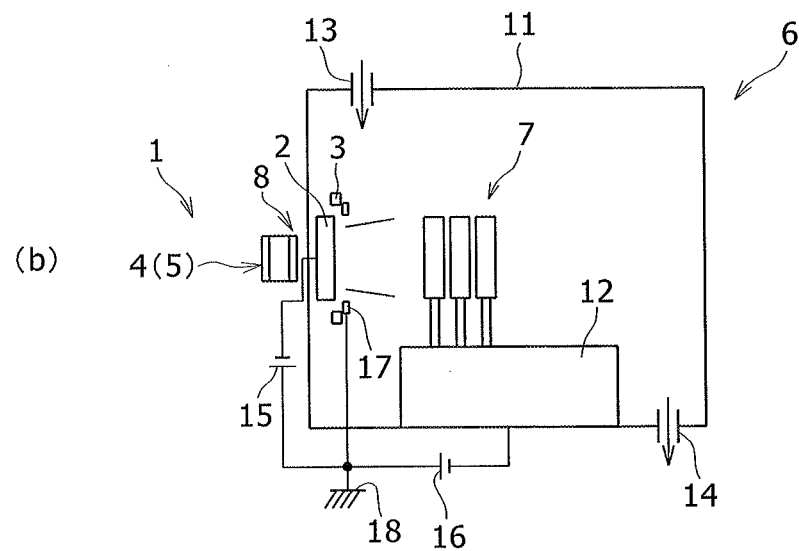

COMPARATIVE EXAMPLE 1

CIRCUMFERENCE MAGNET : INNER DIAMETER 150mm,
OUTER DIAMETER 170mm,
THICKNESS 10mm

REAR SURFACE MAGNET : NONE

MAGNETIC BODY : NONE

COMPARATIVE EXAMPLE 2

CIRCUMFERENCE MAGNET : INNER DIAMETER 150mm,
OUTER DIAMETER 170mm,
THICKNESS 10mm

FIRST PERMANENT MAGNET : INNER DIAMETER 80mm,
OUTER DIAMETER 100mm,
THICKNESS 10mm,
DISTANCE FROM TARGET
SURFACE : 60mm

SECOND PERMANENT MAGNET : INNER DIAMETER 80mm,
OUTER DIAMETER 100mm,
THICKNESS 10mm,
DISTANCE FROM TARGET
SURFACE : 100mm

MAGNETIC BODY : NONE

COMPARATIVE EXAMPLE 3

CIRCUMFERENCE MAGNET : INNER DIAMETER 150mm ,
OUTER DIAMETER 170mm ,
THICKNESS 10mm

FIRST PERMANENT MAGNET : INNER DIAMETER 80mm ,
OUTER DIAMETER 100mm ,
THICKNESS 10mm ,
DISTANCE FROM TARGET
SURFACE : 60mm

SECOND PERMANENT MAGNET : INNER DIAMETER 80mm ,
OUTER DIAMETER 100mm ,
THICKNESS 10mm ,
DISTANCE FROM TARGET
SURFACE : 100mm

MAGNETIC BODY : PRESENCE

COMPARATIVE EXAMPLE 4

CIRCUMFERENCE MAGNET : INNER DIAMETER 150mm ,
OUTER DIAMETER 170mm ,
THICKNESS 10mm

FIRST PERMANENT MAGNET : DIAMETER 100mm ,
THICKNESS 4mm ,
DISTANCE FROM TARGET
SURFACE : 80mm

SECOND PERMANENT MAGNET : DIAMETER 100mm ,
THICKNESS 4mm ,
DISTANCE FROM TARGET
SURFACE : 120mm

MAGNETIC BODY : NONE

EXAMPLES 1, 2

CIRCUMFERENCE MAGNET : INNER DIAMETER 150mm,
OUTER DIAMETER 170mm,
THICKNESS 10mm

FIRST PERMANENT MAGNET : DIAMETER 100mm,
THICKNESS 4mm,
DISTANCE FROM TARGET
SURFACE : 80mm

SECOND PERMANENT MAGNET : DIAMETER 100mm,
THICKNESS 4mm,
DISTANCE FROM TARGET
SURFACE : 120mm

MAGNETIC BODY : PRESENCE

FIG.10
(a) VIEW FOR LINEAR ARRANGEMENT OF ARC EVAPORATION SOURCES
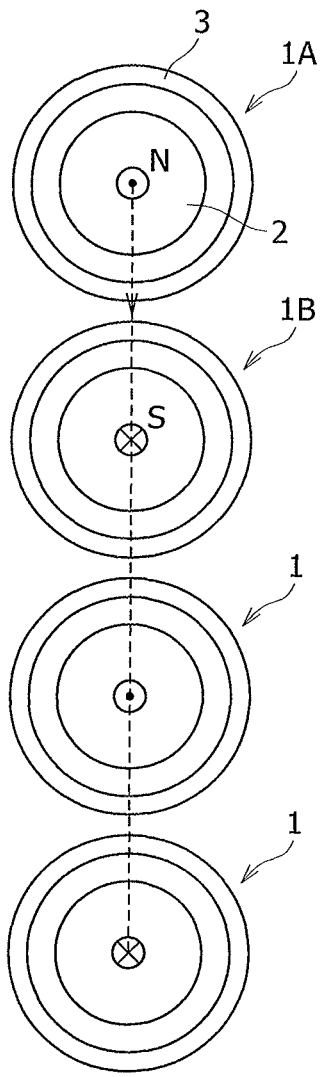
(b) VIEW FOR NON-LINEAR ARRANGEMENT OF ARC EVAPORATION SOURCES
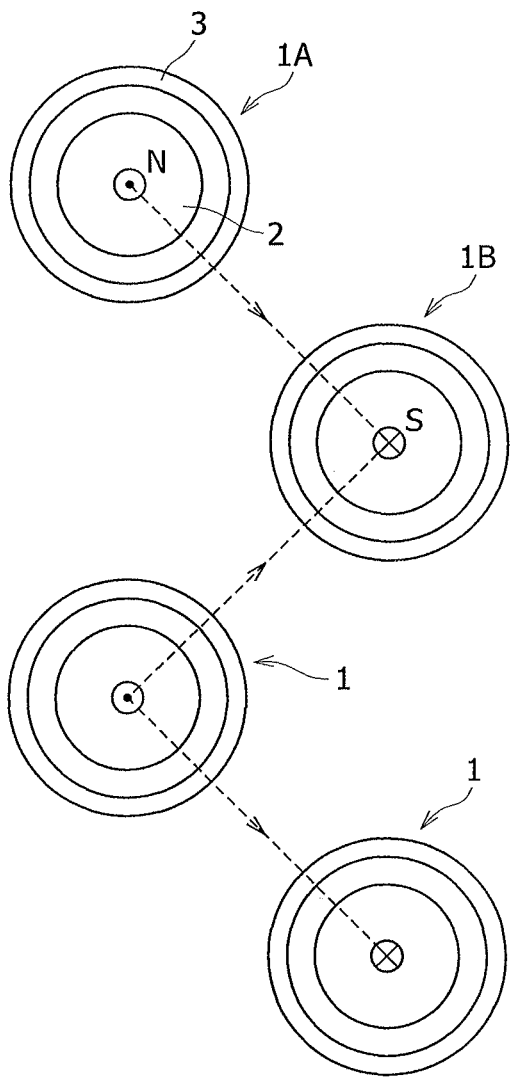

ARC EVAPORATION SOURCE HAVING FAST FILM-FORMING SPEED, COATING FILM MANUFACTURING METHOD AND FILM FORMATION APPARATUS USING THE ARC EVAPORATION SOURCE

TECHNICAL FIELD

The present invention concerns a film formation apparatus used for improvement of wear resistance of mechanical parts, etc., and forming a thin film such as a ceramic film, for example, of a nitride and an oxide, and an amorphous carbon film. Further, the present invention concerns an arc evaporation source used for the film formation apparatus and a method for manufacturing a coating film using the arc evaporation source.

BACKGROUND ART

With an aim of improving wear resistance, sliding characteristic, and protective function, physical vapor deposition methods such as an arc ion plating method and a sputtering method have been known generally as a technique of coating a thin film on the surface of a substrate such as mechanical parts, cutting tools, and sliding parts. In the arc ion plating method, a cathode discharge arc evaporation source is used.

The cathode discharge arc evaporation source generates arc discharge on the surface of a target as a cathode. Thus, a material constituting the target is melted instantaneously and ionized. Then, a thin film is formed by drawing the ionized material to the surface of the substrate as a work. The arc evaporation source has a fast evaporation speed and high ionization rate for the evaporated material constituting the target. Accordingly a dense coating film can be formed by applying a bias to the substrate upon film formation. Accordingly, the arc evaporation source is used industrially for forming a wear resistant coating film, for example, on a cutting tool.

However, when arc discharge is generated between a cathode (target) and an anode, evaporation of the target is generated around an electron emission point (arc spot) on the side of the cathode as a center. In this state, a molten target is released form the vicinity of the arc spot, and is adhered to a work and causes deterioration of the surface roughness.

The amount of the molten target material (macro particle) released from the arc spot tends to be suppressed when the arc spot transfers at a high speed. It has been known that the transfer speed of the arc spot undergoes the effect of a magnetic field applied to the target.

Further, it has been known that target atoms evaporated by arc discharge are electrolytically dissociated, that is, ionized in the arc plasma. There is a problem, for example, that the track of ions from the target to the substrate undergoes the effect of a magnetic field between the target and the substrate.

Further, in a coating film obtained by PVD film formation such as film formation by cathode discharge type arc evaporation source, compressive stress remains in principle. The compressive stress tends to be increased as the thickness of the coating film is larger. Further, when the compressive stress is larger than −2 GPa (compressive stress<−2 GPa), adhesion of the coating film to the tool is lowered and tends to cause peeling. When the thickness of the coating film covering the cutting tool can be increased, the life of the cutting tool can be extended. However, it is difficult to increase the thickness of the coating film due to the reason described above.

For solving such problems, it has been proposed the following attempt of controlling the transfer of the arc spot by applying a magnetic field to the target. For example, Patent literature 1 describes an arc evaporation source having a ring shaped magnetic force generation mechanism (permanent magnet, solenoid coil) disposed to the circumference of a target and applying a vertical magnetic field to the surface of the target. Patent literature 2 describes an ion plating device having a magnetic force generation mechanism (solenoid coil) disposed ahead of the target so as to converge the ionized material constituting the target efficiently in the direction of the substrate. Patent literature 3 describes an evaporation source for an arc ion plating device having a permanent magnet disposed to the central position at the rear surface of the target, a ring shaped magnet disposed at the rear surface of the target so as to surround the permanent magnet and having a polarity different from that of the permanent magnet, and a solenoid coil forming a magnetic field component so as to confine arc discharge and having a diameter substantially equal with that of the ring shaped magnet. Patent literature 4 describes an arc vapor deposition apparatus having a ring shaped magnet disposed to the circumference of a target and a solenoid coil disposed at the rear surface of the target and forming a magnetic field in parallel with the surface of the target by the solenoid coil.

However, according to the magnetic force generation mechanism described in the Patent literature 1, lines of magnetic force from the surface of the target extend to the magnet on the side of the target. Accordingly, most of ions are guided in a direction to the magnet. Further, the lines of magnetic force extending in the direction to the substrate ahead of the target are directed to a direction greatly deviating from the substrate. Therefore, evaporated and ionized material of the target cannot efficiently reach the substrate.

Further, in the technique described in the Patent literature 2, although the lines of magnetic force extend in the direction to the substrate, a large sized solenoid coil has to be placed between the target and the substrate. Accordingly, the distance between the target and the substrate is necessarily made longer and, as a result, the film-forming speed is lowered.

Further, in the arrangement disclosed in the Patent literature 3, arc discharge tends to be generated preferentially at a point where the vertical component of the magnetic field (component in the vertical direction of the magnetic field to the surface of the target) is decreased to 0. Accordingly, even when the solenoid coil is used, the position where the arc discharge is generated is trapped substantially at an intermediate portion between the permanent magnet and the ring shaped magnet and it is difficult to control the position to a further inner circumferential portion. Accordingly, the efficiency of utilizing the target cannot be improved. Further, in the arrangement described in the Patent literature 3, there is no component of the lines of magnetic force extending forwardly from the target. Accordingly, ions emitted from the target are not efficiently converged to the substrate.

Then, the Patent literature 4 only describes an embodiment in which the inner diameter of the solenoid coil is smaller than the diameter of the target. In this case, the lines of magnetic force tend to be diverged from the target to the outside and it is considered that ions cannot be converged efficiently. Further, in the arc vapor deposition apparatus described in the Patent literature 4, discharge of arc plasma is transferred at a high speed in order to obtain a strength necessary for the magnetic field parallel to the surface of the target. Accordingly, in combination with the solenoid coil (or magnetic body yoke), it is necessary to supply a large current to a large-sized solenoid coil to increase the size of the evaporation source which is not preferred industrially.

CITATION LIST

Patent Literature

Patent Literature 1: JP-A 2000-328236
Patent Literature 2: JP-A Hei 07 (1995)-180043
Patent Literature 3: JP-A 2007-056347
Patent Literature 4: JP-T 2004-523658

SUMMARY OF INVENTION

An object of the present invention is to provide an arc evaporation source having a high film-forming speed, a manufacturing method for a coating film and a film formation apparatus using the arc evaporation source.

For attaining the object, the present invention provides an arc evaporation source of generating arc discharge to the surface of a target thereby melting the target including, at least one circumference magnet disposed so as to surround the circumference of the target and such that the direction of magnetization thereof is in perpendicular to the surface of the target, a non-ring shaped first permanent magnet disposed on the side of the rear surface of the target, having a polarity in the same direction as the polarity of the circumference magnet, and such that the direction of magnetization thereof is in perpendicular to the surface of the target, a non-ring shaped second permanent magnet disposed between the first permanent magnet and the target or on the side of the rear surface of the first permanent magnet in a state of leaving a gap to the first permanent magnet, having a polarity in the same direction as the polarity of the circumference magnet, and such that the direction of magnetization thereof is in perpendicular to the surface of the target, and a magnetic body disposed between the first permanent magnet and the second permanent magnet.

Further, the present invention provides a method for manufacturing a coating film including a coating film forming step of forming a coating film by using the arc evaporation source.

Further, the present invention provides a film formation apparatus including the arc evaporation source and an arc power source that applies a voltage to the arc evaporation source for generating arc discharge.

According to the invention, the film-forming speed of the film formation apparatus using the arc evaporation source can be increased.

BRIEF DESCRIPTION OF DRAWINGS

FIG. 1 is a schematic view of a film formation apparatus of a first embodiment having an arc evaporation source according to an embodiment of the present invention in which (a) is a plan view and (b) is a side elevational view respectively.

FIG. 10 is a view along arrows A-A in FIG. 9 in which (a) is a view where arc evaporation sources are arranged linearly and (b) is a view where the arc evaporation sources are arrange not linearly.

DESCRIPTION OF EMBODIMENTS

Figure 2:
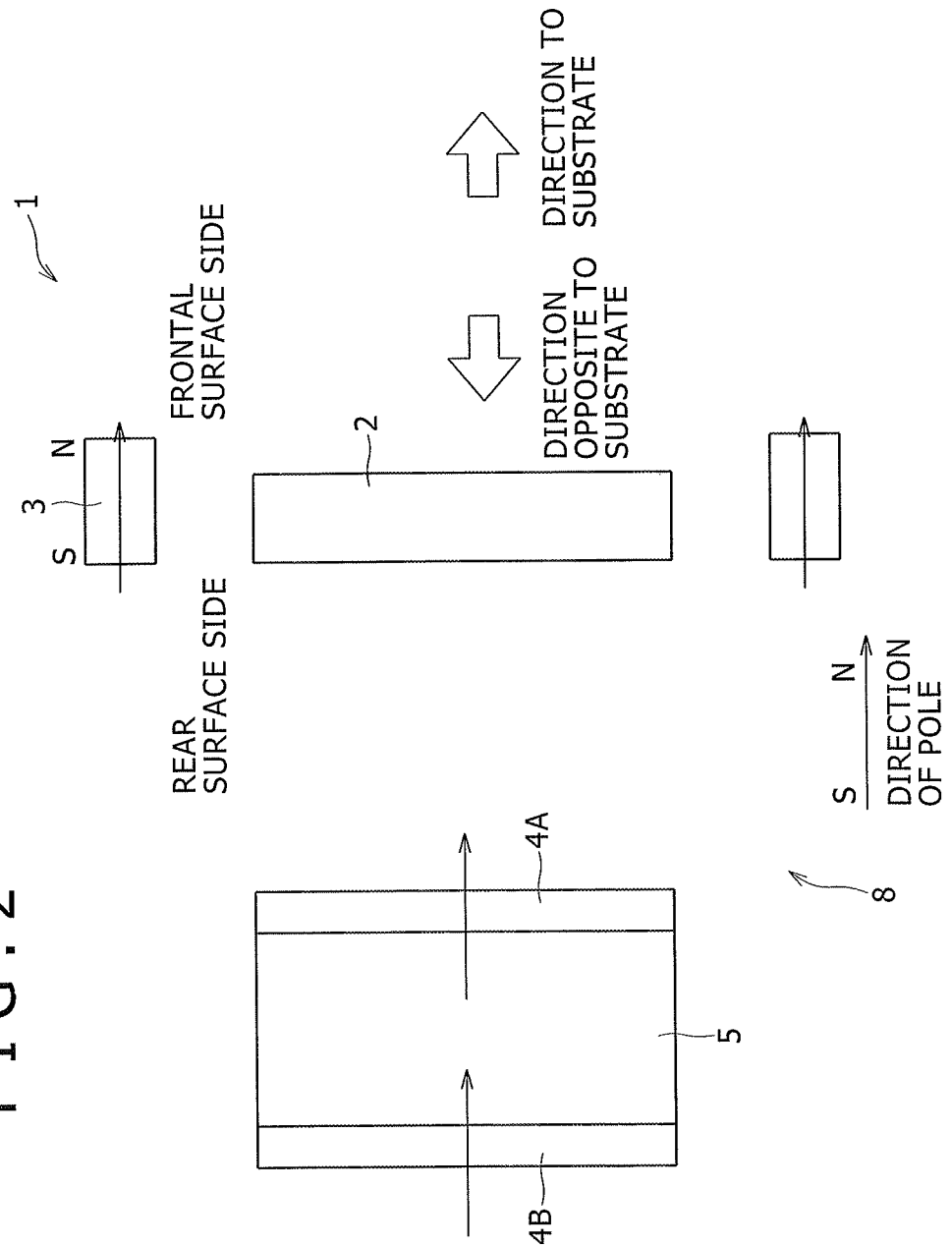
FIG. 2 is a schematic view of an arc evaporation source according to Example 1 of the invention.

Embodiments of the invention are to be described with reference to the accompanying drawings. The following embodiments are examples of embodying the invention and do not intend to restrict the technical range of the invention.

First Embodiment

FIG. 1 shows a film formation apparatus 6 of a first embodiment having an arc evaporation source 1 (hereinafter referred to as evaporation source 1) according to an embodiment of the invention.

The film formation apparatus 6 has a vacuum chamber 11, a rotary base 12 disposed in the vacuum chamber 11 and supporting a substrate 7 as a work, an evaporation source 1 partially disposed in the vacuum chamber 11 and attached being directed to the substrate 7, an arc power source 15 for applying a negative bias to the evaporation source 1, and a bias power source 16 for applying a negative bias to the substrate 7.

The vacuum chamber 11 is provided with a gas introduction port 13 for introducing a reaction gas into the vacuum chamber 11 and a gas exhaust port 14 for exhausting the reaction gas from the inside of the vacuum chamber 11.

The arc power source 15 applies a negative bias to a target 2 of the evaporation source 1 to be described later. The positive electrode of the arc power source 15 and the positive side of the bias power source 16 are connected to the ground 18 respectively.

As shown in FIG. 1, the evaporation source 1 has a disk shaped (hereinafter "disk shaped" also means a cylindrical shape having a predetermined height) target 2, a magnetic field forming means 8 disposed near the target 2, and an anode 17 disposed to the circumference of the target 2. The anode 17 is connected to the ground 18, and also the vacuum chamber 11 at the same potential as that of the anode 17 can operate as the anode 17. That is, the evaporation source 1 is a cathode discharge type arc evaporation source.

The target 2 comprises a material selected in accordance with a thin film to be formed on the substrate 7 (for example, chromium (Cr), titanium (Ti), titanium aluminum (TiAl), or carbon (C)).

The magnetic field forming means 8 has a circumference magnet 3 disposed so as to surround the circumference of the target 2, a rear surface magnet 4 and the magnetic body 5 disposed on the side of the rear surface of the target 2. The circumference magnet 3 and the rear surface magnet 4 are disposed such that the direction of the polarity of the circumference magnet 3 and the direction of the polarity of the rear surface magnet 4 are identical. In the magnetic field forming means 8, the circumference magnet 3 is disposed in the vacuum chamber 11 and the rear surface magnet 4 and the magnetic body 5 are disposed outside of the vacuum chamber 11.

Figure 3:
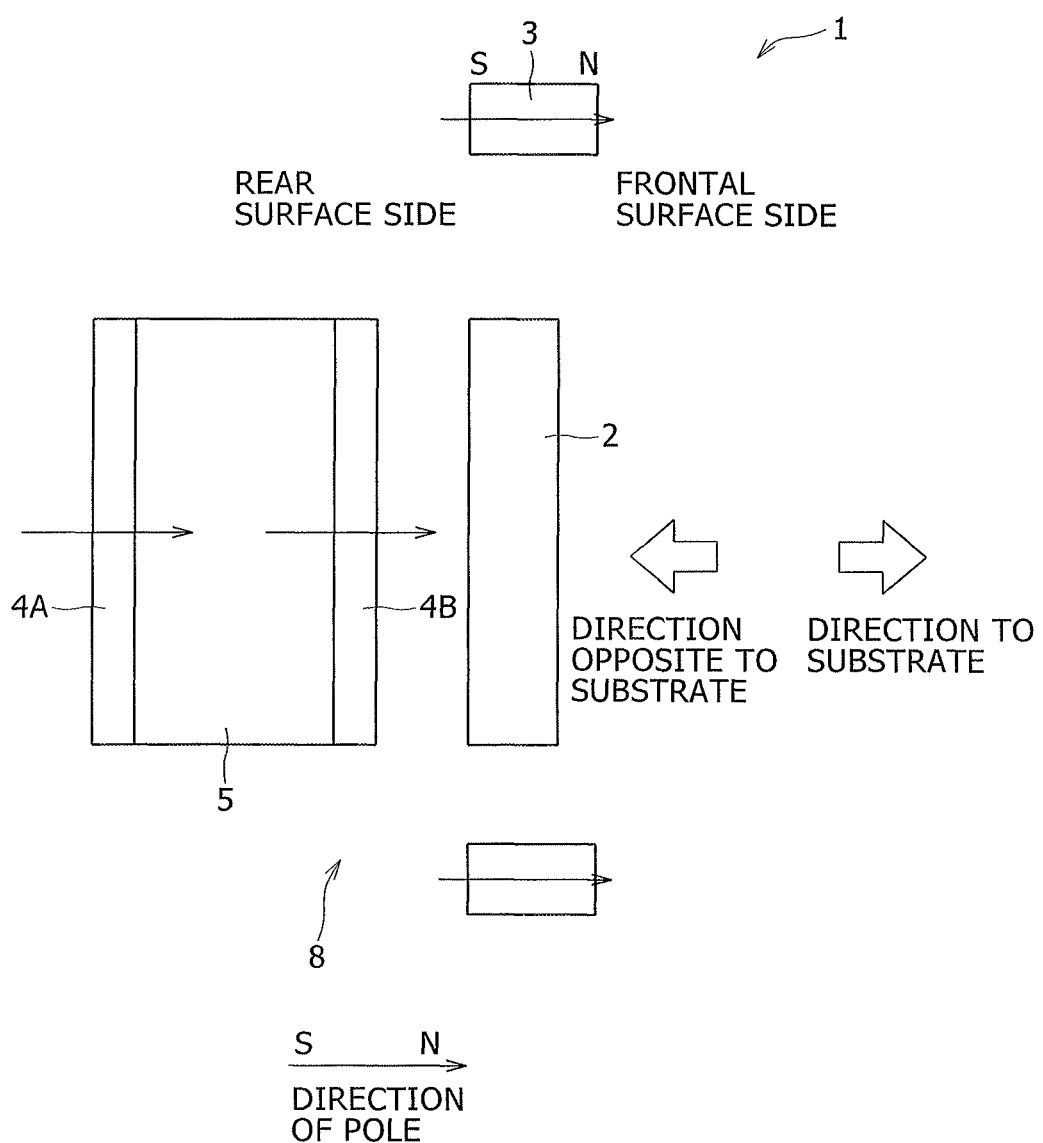
FIG. 3 is a schematic view of an arc evaporation source according to Example 2 of the invention.

The evaporation surface of the target 2 (surface on the side of the substrate 7) is referred to as "frontal surface" and the surface on the opposite side is referred to as "rear surface" (refer to FIG. 2 and FIG. 3).

The circumference magnet 3 and the rear surface magnet 4 comprise a permanent magnet formed of a neodymium magnet having high coercivity.

The circumference magnet 3 is ring shaped and disposed so as to be coaxial with the target 2. The circumference magnet 3 is disposed so that the direction is along the axis of the target 2 (perpendicular to the evaporation surface of a material constituting the target 2). Further, the circumference magnet 3 is disposed such that the projected plane in the radial direction of the circumference magnet 3 overlaps with the projected plane in the radial direction of the target 2. That is, the circumference magnet 3 is disposed such that shadows formed by projecting the circumference magnet 3 and the target 2 in the direction parallel to the evaporation surface of the target 2 overlap with each other.

The circumference magnet 3 may be formed also by disposing a plurality of permanent magnets of a cylindrical shape or the like so as to surround the circumference of the target 2 (circular shape). That is, "ring shape" also includes a state of arranging a plurality of magnets along the circumference of the target 2.

The rear surface magnet 4 is disposed such that the direction of magnetization thereof is along with the axis of the target 2 (perpendicular to the evaporation surface of the material constituting the target 2) and on the side of the rear surface of the target.

Further, the rear surface magnet 4 has a polarity in the same direction as the polarity of the circumference magnet 3. Specifically, for each of the circumference magnet 3 and the rear surface magnet 4 in FIG. 2 and FIG. 3, the polarity on the side near the substrate 7 is an N-pole, and the polarity on the side remote from the substrate 7 is an S-pole. On the contrary, the circumference magnet 3 and the rear surface magnet 4 may be disposed such that the polarity on the side near the substrate 7 is the S-pole and the polarity on the side remote from the substrate 7 is the N-pole.

The magnetic field forming means 8 has the configuration as described above. Therefore, it is possible to guide the lines of magnetic force in the direction of the substrate 7 by the combination of a magnetic field formed by the circumference magnet 3 disposed to the circumference of the target 2 and a magnetic field formed by the rear surface magnet 4 disposed on the side of the rear surface of the target 2.

The rear surface magnet 4 in this embodiment is non-ring shaped as in disk shaped rear surface magnets 4A, 4B to be described later. "Non-ring shape" means those different from doughnut's shape not having a hole in the radial inside but those of solid shape filled with contents, and includes also disk shape, circular cylindrical shape, etc.

That is, "non-ring shape" means such a shape that none of normal lines directing from the surface to the outward intersect to each other.

FIG. 2 shows a magnetic field forming means 8 of Example 1. The rear surface magnet 4 has a disk shaped rear surface magnet 4A (first permanent magnet) and another disk shaped rear surface magnet 4B (second permanent magnet) disposed at the rear surface of the disk shaped rear surface magnet 4A. The magnetic body 5 is disposed between the disk shaped rear surface magnet 4A and the disk shaped rear surface magnet 4B.

FIG. 3 shows a magnetic field forming means 8 of Example 2. In the magnetic field forming means 8 of Example 2, the arrangement of the first permanent magnet 4A and the second permanent magnet 4B is replaced while keeping the direction of the poles and the direction of magnetization.

Then, a film forming method by using the film formation apparatus 6 having the evaporation source 1 is to be described.

At first, the inside of the vacuum chamber 11 is evacuated by depressurizing the inside of the vacuum chamber 11. Then, an argon gas (Ar) or the like is introduced from the gas introduction port 13. Then, impurities such as oxides on the target 2 and the substrate 7 are removed by sputtering and the inside of the vacuum chamber 11 is again evacuated. Then, a reaction gas is introduced from gas introduction port 13 into the vacuum chamber 11. In this state, arc discharge is generated on the target 2 disposed to the vacuum chamber 11 thereby evaporating and ionizing the material constituting the target 2 and reacting the same with the reaction gas. Thus, a nitride film, oxide film, carbide film, carbonitride film, or amorphous carbon film is formed on the substrate 7 placed on the rotary base 12.

As the reaction gas, a nitrogen gas ($N_2$), an oxygen gas ($O_2$), or a hydrocarbon gas such as methane ($CH_4$) may be selected according to the application use. Further, the pressure of the reaction gas in the vacuum chamber 11 is set to about 1 to 7 Pa. Further, the arc discharge current during film formation is set to 100 to 200 A. A negative voltage at 10 to 200 V is applied to the substrate 7 from the bias power source 16.

Example 1, Example 2

Example 1 using the evaporation source 1 according to the invention is to be described.

The rear surface magnet 4 according to this example has a disk shaped (columnar) permanent magnet (hereinafter referred to as "disk shaped rear surface magnet 4A (first permanent magnet)"), and the other disk shaped permanent magnet (hereinafter referred to as "disk shaped rear surface magnet 4B (second permanent magnet)") disposed on the side of the rear surface of the disk shaped rear surface magnet 4A (on the side opposite to the substrate 7) leaving a gap relative to the disk shaped rear surface magnet 4A. A disk shaped magnetic body 5 is provided between the disk shaped rear surface magnets 4A and 4B.

The shape of the plane formed by projecting each of the disk shaped rear surface magnets 4A and 4B and the magnetic body 5 in a direction perpendicular to the surface thereof (hereinafter referred to as "shape of projected plane") is similar to the shape of projected plane of the target 2. Further, the axial line of each of the disk shaped rear surface magnets 4A and 4B, the axial line of the magnetic body 5, and the axial line of the target 2 are situated respectively on one identical straight line.

Each of the disk shaped rear surface magnets 4A and 4B is formed of a neodymium magnet of high coercivity. Accordingly, the entire magnetic field forming means 8 can be made compact.

While the magnetic body 5 according to the Examples 1 and 2 is formed of easily available and inexpensive carbon steel, the material of the magnetic body is not restricted thereto but the magnetic body 5 can be formed, for example, of a material having a specific magnetic permeability of more than 1. This is because any material having a specific magnetic permeability more than 1 can be served as a magnetic guide.

Since the magnetic body 5 is formed of the material having a specific magnetic permeability of 250 or more, the function of the magnetic body 5 as a magnetic guide is improved. Specifically, cobalt (specific magnetic permeability: 250), nickel (specific magnetic permeability: 600), carbon steel (specific magnetic permeability: 1,000), iron (specific magnetic permeability: 5,000), ferrosilicon (specific magnetic permeability: 7,000), pure iron (specific magnetic permeability: 200,000), etc. are preferably used as the material for the magnetic body 5.

Both end faces of the magnetic body 5 are in close contact with the end face of the disk shaped rear surface magnet 4A (first permanent magnet) on the side of the rear surface (opposite to the substrate 7) and the end face of the disk shaped rear surface magnet 4B (second permanent magnet) on the side of the substrate 7, respectively.

Example 2 is different from Example 1 only in that the position for the first permanent magnet 4A and the position for the second permanent magnet 4B are replaced to each other. That is, each of the permanent magnets 4A and 4B has an identical shape. Hereinafter, also Example 2 is to be described together.

The diameter of the target 2 is 100 mm. The thickness of the target 2 is 16 mm. Further, the target 2 is formed of titanium aluminum (TiAl) with the atomic ratio of titanium (Ti) and aluminum (Al) of 1:1.

The outer diameter of the circumference magnet 3 is 170 mm. The inner diameter of the circumference magnet 3 is 150 mm. The thickness of the circumference magnet 3 is 10 mm.

Nitrogen ($N_2$) is selected as the reaction gas in Example 1. The pressure of the reaction gas is 4 Pa. The film formation time is 30 min. The arc discharge current is 150 A. A negative voltage at 30 V is applied to the substrate 7 by using the bias power source 16.

The substrate 7 is a chip of a mirror polished super hard alloy sized 15 mm×15 mm×5 mm. Further, the substrate 7 is disposed at a position apart by about 180 mm from the surface of the target 2. The temperature of the substrate 7 is set to 500° C.

Also in Comparative Example 1 to Comparative Example 4 shown in FIG. 4 to FIG. 7, the conditions for the target 2, the circumference magnet 3, the arc current value, the reaction gas, the film formation time, the applied negative voltage, and the substrate 7 are identical.

Comparative Example 1 is a comparative example not having the rear surface magnet 4 on the side of the rear surface of the target 2.

Comparative Example 2 is a comparative example having two ring shaped permanent magnets disposed on the side of the rear surface of the target 2. In Comparative Example 2, the outer diameter of each of the two ring shaped permanent magnets disposed on the side of the rear surface of the target 2 is 100 mm. The inner diameter of each of the ring shaped permanent magnets is 80 mm. The thickness of each of the ring shaped permanent magnet is 10 mm. Further, one of the ring shaped permanent magnets is disposed at a position of 60 mm from the surface of target 2 and the other of them is disposed at a position of 100 mm from the surface target 2.

Comparative Example 3 is a comparative example having two ring shaped permanent magnets disposed on the side of the rear surface of the target 2 and carbon steel as a magnetic body disposed between each of the permanent magnets. The carbon steel as the magnetic body is disposed being in close contact with the two ring shaped permanent magnets. The shape of each of the permanent magnets and the distance of each of the permanent magnets from the surface of the target 2 are identical with those of Comparative Example 2.

Comparative Example 4 is a comparative example having two disk shaped permanent magnets disposed on the side of the rear surface of the target 2. In Comparative Example 4, a magnetic body is not disposed between the two disk shaped permanent magnets.

Table 1 shows the number of sheets of the rear surface magnets, the thickness of the rear surface magnets, the diameter for each of the magnets, the distance from the surface of the target 2, the value of current flowing to the substrate 7, evaluation for the film-forming speed, the value of film residual stress, and the result of evaluation for the residual film stress for Comparative Example 1 to Comparative Example 4 and Example 1 (also for Example 2).

In Table 1, each of the magnets in the comparative examples are also defined as the first permanent magnet and the second permanent magnet for the sake of convenience.

TABLE 1

| Example of measurement | | Number of sheets of rear surface magnet | Thickness of rear surface magnet (mm) | Diameter of first permanent magnet (mm) | Diameter of second permanent magnet (mm) | Distance from the target surface (mm) | Presence or absence of magnetic body | Value of current value flowing to substrate (A) | Evaluation for film-forming speed | Residual stress value in coating film (GPa) | Evaluation on residual stress in coating film |
|---|---|---|---|---|---|---|---|---|---|---|---|
| Comparative example to the invention | Comp. Example 1 | — | — | — | — | — | none | 1.0 | x | −2.40 | x |
| | Comp. Example 2 | 2 | 10, 10 | — | — | 60, 100 | none | 1.1 | x | −2.30 | x |
| | Comp. Example 3 | 2 | 10, 10 | — | — | 60, 100 | present | 1.2 | x | −2.25 | x |
| | Comp. Example 4 | 2 | 4, 4 | 100 | 100 | 80, 120 | none | 1.3 | x | −2.09 | x |
| Examples 1, 2 of the invention | | 2 | 4, 4 | 100 | 100 | 80, 120 | present | 3.6 | ○ | −0.19 | ○ |

Then, evaluation on the film-forming speed and the residual stress on the substrate 7 is to be described.

The film-forming speed is in proportion to an ionic current flowing to the substrate 7 by arc discharge. That is, as the value of current flowing to the substrate 7 is larger, the film-forming speed is higher. In view of productivity and operation efficiency, the current value in proportion to the film-forming speed is preferably 1.5 A or more. Accordingly, a current value of 1.5 A or more is evaluated as satisfactory.

Further, the residual stress in the thin film was calculated according to the Storney's equation shown in the formula (I). Specifically, film was formed on an Si wafer of 1 mm thickness, and the radius of curvature for the distortion of the substrate 7 after film formation was measured by utilizing an optical lever. The radius of curvature was used as the radius of curvature R in the formula (I). Assuming the peeling of a hard film for use in a cutting tool, the residual stress of the thin film at an absolute value of 2.0 GPa or less was evaluated as satisfactory.

$$\sigma_f = \frac{E_s t_s^2}{6R(1-v_s)t_f} \quad (1)$$

$\sigma_f$: residual stress
$E_s$: Young's modulus of substrate
$t_s$: thickness of substrate
$v_s$: Poison ratio of substrate
$t_f$: film thickness
R: radius of curvature of substrate in a distorted state At first, the distribution chart for lines of magnetic force in each of measurement examples is to be considered.

Figure 4:
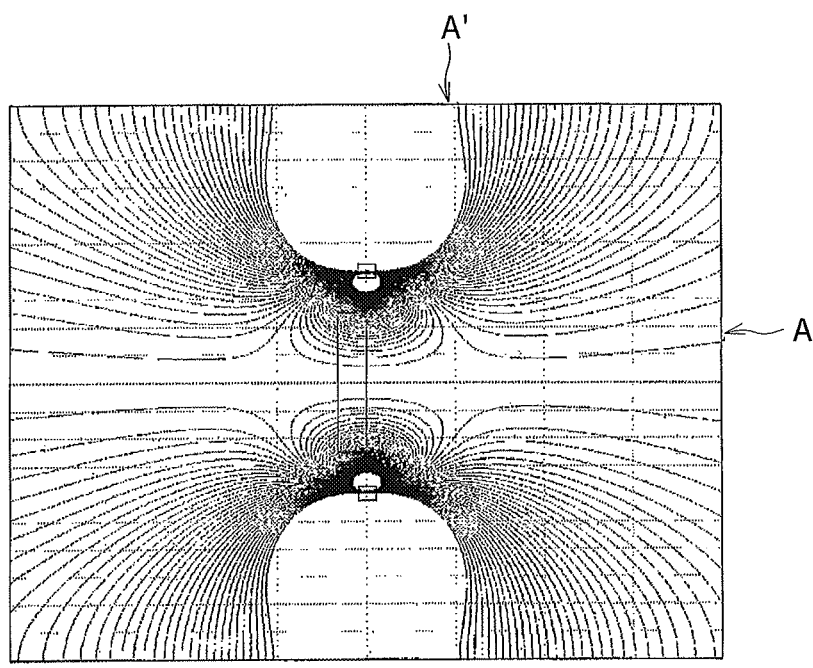
FIG. 4 is a distribution chart for lines of magnetic force of an arc evaporation source of Comparative Example 1.

The distribution chart for lines of magnetic force of Comparative Example 1 is shown in FIG. 4. As shown in FIG. 4, the lines of magnetic force extending forward from the target 2 in Comparative Example 1 are greatly deviated from the frontal direction of the target 2 (that is, direction to the substrate 7).

Specifically, in Comparative Example 1, lines of magnetic force nearest to the axis of the target 2 are apart from the axis of the target 2 as far as by about 28 mm already at a point where they progress by about 200 mm in the direction from the surface of the target 2 to the substrate 7 (refer to arrow A in FIG. 4).

Figure 5:
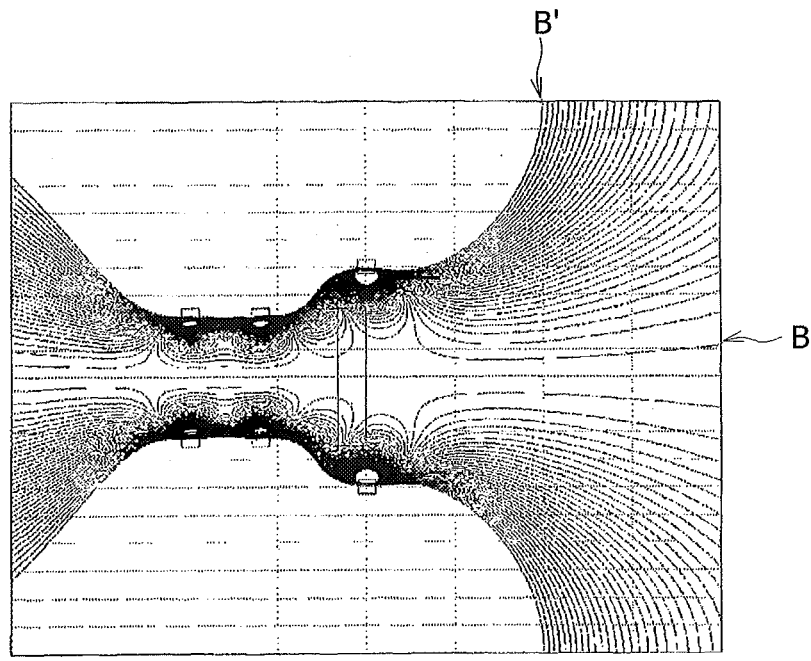
FIG. 5 is a distribution chart for lines of magnetic force of an arc evaporation source of Comparative Example 2.

The distribution chart for lines of magnetic force in Comparative Example 2 is shown in FIG. 5. In Comparative Example 2, the lines of magnetic force nearest to the axis of the target 2 are apart from the axis of the target 2 by about 24 mm already at a point where they progress by about 200 mm in the direction from the surface of the target 2 to the substrate 7 (refer to arrow B in FIG. 5).

Figure 6:
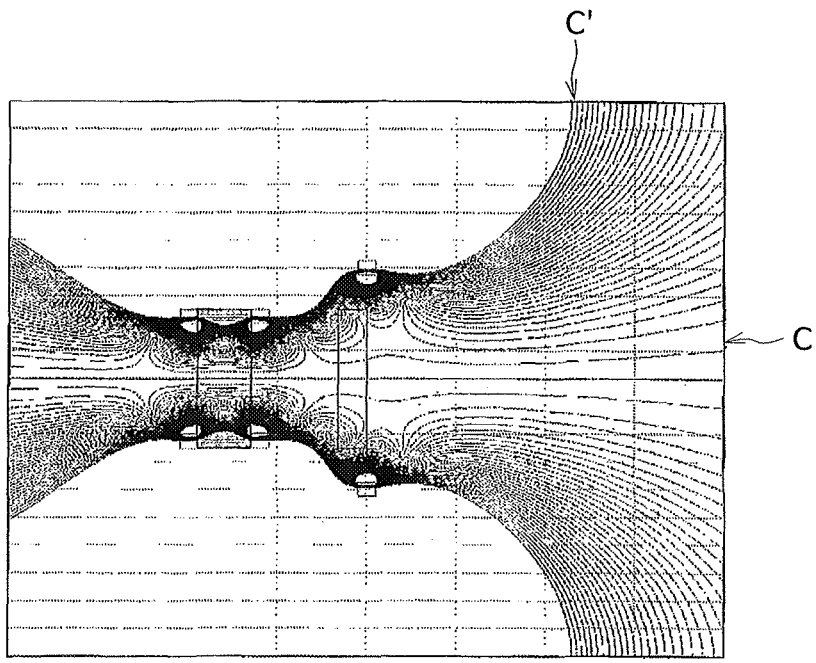
FIG. 6 is a distribution chart for lines of magnetic force of an arc evaporation source of Comparative Example 3.
Figure 7:
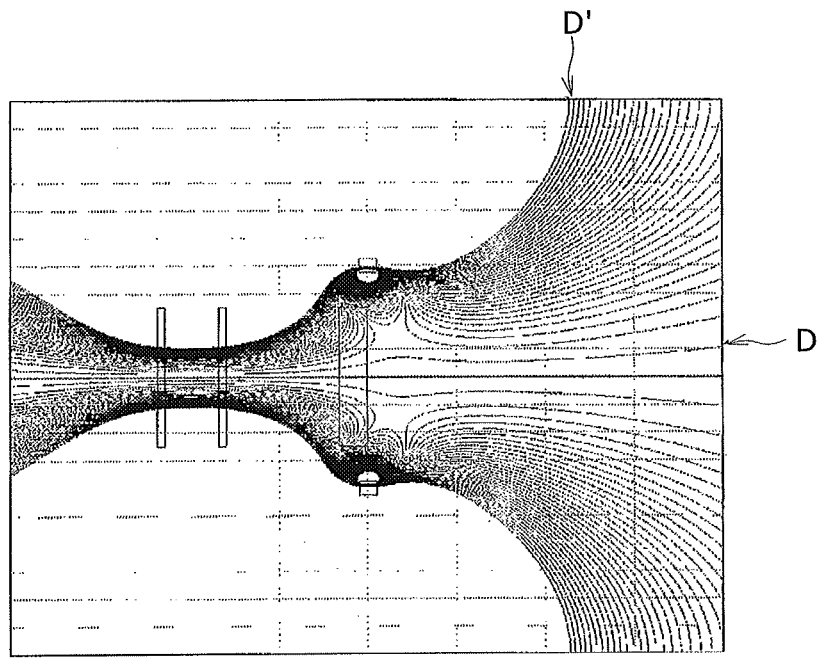
FIG. 7 is a distribution chart for lines of magnetic force of an arc evaporation source of Comparative Example 4.

The distribution chart for lines of magnetic force of Comparative Example 3 is shown in FIG. 6. The distribution chart for lines of magnetic force of Comparative Example 4 is shown in FIG. 7. In Comparative Example 3 and Comparative Example 4, the lines of magnetic force nearest to the axis of the target 2 are apart by about 20 mm from the axis of the target 2 at a position of about 200 mm from the surface of the target 2 in the same manner as in Comparative Examples 1 and 2 (refer to arrow C in FIG. 6 and arrow D in FIG. 7).

Then, in each of the comparative examples, lines of magnetic force most remote from the axis of the target 2 are to be considered.

In Comparative Example 1, lines of magnetic force most remote from the axis of the target 2 are apart as far as by 200 mm from the axis of the target 2 already at a position progressing only by about 50 mm in a direction from the surface of the target 2 to the substrate 7 (refer to arrow A' in FIG. 4). As described above, it can be seen that the lines of the magnetic force most remote from the axis of the target 2 are greatly deviated from the axis of the target 2 in Comparative Example 1.

In the same manner in Comparative Example 2 to Comparative Example 4, the lines of magnetic force most remote from the axis of the target 2 are apart as far as by 200 nm from the axis of the target 2 already at a position progressing only by about 100 to 115 mm in the direction from the surface of the target 2 to the substrate 7 (refer to arrows B', C', and D' in FIG. 5 to FIG. 7).

As described above, in Comparative Example 1 to Comparative Example 4, the lines of magnetic force extending forward from the target 2 are greatly deviated from the direction to the substrate 7. Correspondingly, the track of ions also tends to be deviated from the direction to the substrate 7.

As a result, as shown in Table 1, values of current flowing in the substrate 7 in Comparative Examples 1 to 4 are as small as 1.0 A, 1.1 A, 1.2 A, and 1.3 A respectively. As a result, the film-forming speed is also evaluated as failed in Comparative Example 1 to Comparative Example 4. Accordingly, efficient film formation is difficult.

Further, in Comparative Examples 1 to 4, the track of ions is greatly deviated from the substrate 7 and the film-forming speed is slow. Accordingly, as shown in Table 1, the value of film residual stress in Comparative examples 1 to 4 show −2.40 GPa, −2.30 GPa, −2.25 GPa, and −2.09 GPa, respectively. As a result, the film residual stress is also evaluated as failed. Accordingly, films with low film residual stress cannot be formed.

Figure 8:
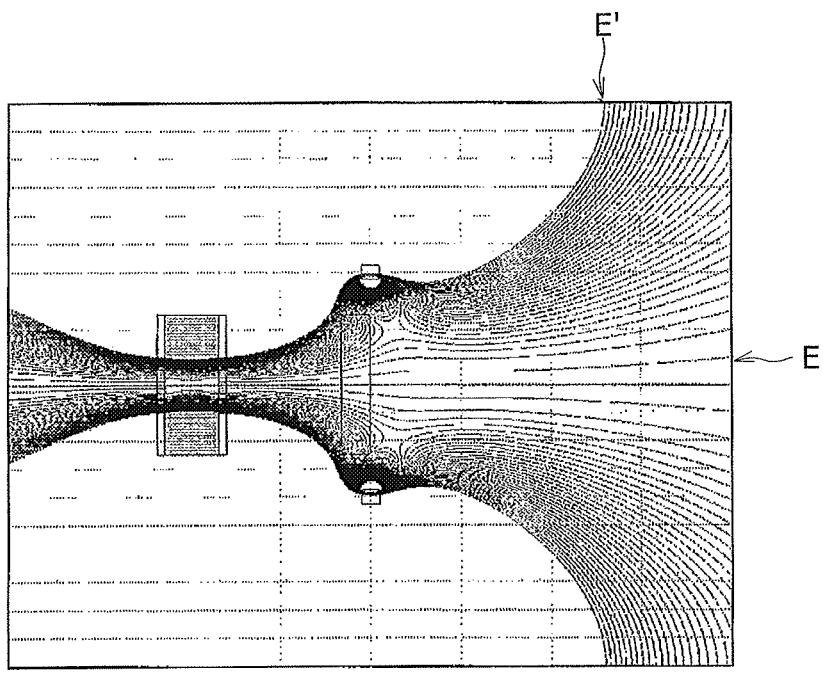
FIG. 8 is a distribution chart for lines of magnetic force of an arc evaporation source according to the invention.

Contrary to the comparative examples, in Example 1 and Example 2 of the invention, lines of magnetic force can be guided in the direction to the substrate 7 as shown in FIG. 8.

Specifically, in Example 1 and Example 2, the lines of magnetic force nearest to the axis of the target 2 is not apart by 20 mm from the axis of the target 2 at a position progressing 200 mm in the direction from the surface of the target 2 to the substrate 7 (refer to arrow E in FIG. 8). Accordingly, a great amount of the lines of magnetic force can be guided to the substrate 7.

Further, in Example 1 and Example 2, it takes a distance of about 130 mm in the direction from the surface of the target 2 to the substrate 7 for the lines of magnetic force most apart from the axis of the target 2 till they are apart by 200 mm from the axis of the target 2 (refer to arrow E' in FIG. 7). Accordingly, a great amount of the lines of magnetic force extend in the direction from the target 2 to the substrate 7.

In addition, in Example 1 and Example 2, both end faces of the magnetic body 5 are in close contact with end faces of the respective disk shaped rear surface magnets 4A and 4B. Thus, the lines of magnetic force extending from the end face of each of the disk shaped rear surface magnets 4A and 4B can be connected with no leakage.

As a result, as shown in Table 1, values of the current flowing to the substrate 7 in Example 1 and Example 2 of the invention is 1.5 A or more. Thus, the evaluation for the film-forming speed is judged as satisfactory. Accordingly, in Example 1 and Example 2, the film-forming speed is faster compared with Comparative Example 1 to Comparative Example 4, and efficient film formation is possible.

Further, in Example 1 and Example 2, absolute values of the film residual stress show 2.0 GPa or less. As a result, the film residual stress is evaluated as satisfactory. Accordingly, films of low residual stress can be formed.

The diameter of the disk shaped rear surface magnets 4A and 4B and the magnetic body 5 may be 40 mm. That is, the area of the surface opposing the target 2 (hereinafter simply referred to as "surface") may be 400 $\pi$mm$^2$. Thus, the surface are of the target 2 is 0.16 times ($^{16}/_{100}$) compared with the case where the diameter is 100 mm (in a case where the surface area is 2500 $\pi$mm$^2$).

Further, the diameter of the disk shaped rear surface magnets 4A and 4B and the magnetic body 5 may be 80 mm. That is, the area of the surface of each of the magnets 4A and 4B, and the magnetic body 5 may be 1600 $\pi$mm$^2$. Thus, the surface are of the target 2 is 0.64 times (64/100) compared with the case where the diameter is 100 mm (in a case where the surface area is 2500 mm²).

That is, the surface area of each of the disk shaped rear surface magnets 4A and 4B and the magnetic body 5 may be 0.25 times (¼) or more of the surface area of the target 2. Also in this case, a larger amount of lines of magnetic force can be guided to the substrate 7 by suppressing deviation of the lines of magnetic force from the axis of the target 2. Thus, ions evaporated from the target 2 can be guided efficiently to the substrate 7.

The surface area of the disk shaped rear surface magnets 4A and 4B and the magnetic body 5 is preferably 0.64 times (64/100) or more of the surface area of the target 2 and, more preferably, 1.0 times or more of the surface area of the target 2. Further, as a preferred upper limit, the diameter of the disk shaped rear surface magnets 4A and 4B is 1.5 times as large as the diameter of the target 2. That is, the surface area of the disk shaped rear surface magnets 4A and 4B is preferably 2.25 times (9/4) or less of the surface area of the target 2.

Further, electrons emitted by arc discharge undergo a force to move in a direction at a right angle to a component of lines of magnetic force in a direction parallel to the surface of the target 2 (hereinafter referred to as "parallel component") (that is, direction to the substrate 7). The moving speed of an arc spot is in proportion to the intensity of the parallel component of the lines of magnetic force.

The parallel component of the lines of magnetic force is increased at a position where the component of the lines of magnetic force perpendicular to the surface of the target 2 (hereinafter referred to as "vertical component") is at 0 (including values in the vicinity of 0 here and hereinafter). Further, arc discharge tends to be generated preferentially at the position where the vertical component of the line of magnetic force is at 0. The position where the vertical component is decreased to 0 is determined by the distance to the surface of the disk shaped rear surface magnet on the side near the surface of the target 2. Accordingly, when the distance is short, arc discharge tends to be generated at the circumferential portion and ions are generated at the outer side. On the other hand, when the distance is increased, the point where the vertical component of the lines of the magnetic force are at 0 is shifted to the central portion and the ions can reach the substrate 7 efficiently.

However, when the distance is excessively far, the lines of magnetic force on the surface of the target 2 and the lines of magnetic force extending in the direction to the substrate 7 are weakened and cannot efficiently carry the ions.

For changing the position of the lines of magnetic force with a vertical component of 0 and having only the parallel component, a mechanism of moving each of the disk shaped rear surface magnets 4A and 4B and the magnetic body 5 forward and backward so as to approach or recede from the target 2 can be incorporated. By changing the distance of each of the magnets 4A and 4B and the magnetic body 5 from the surface of the target 2, the intensity of the parallel component of the lines of magnetic force can be controlled, as well as the point where the vertical component of the lines of magnetic force is at 0 can be controlled.

Second Embodiment

Figure 9:
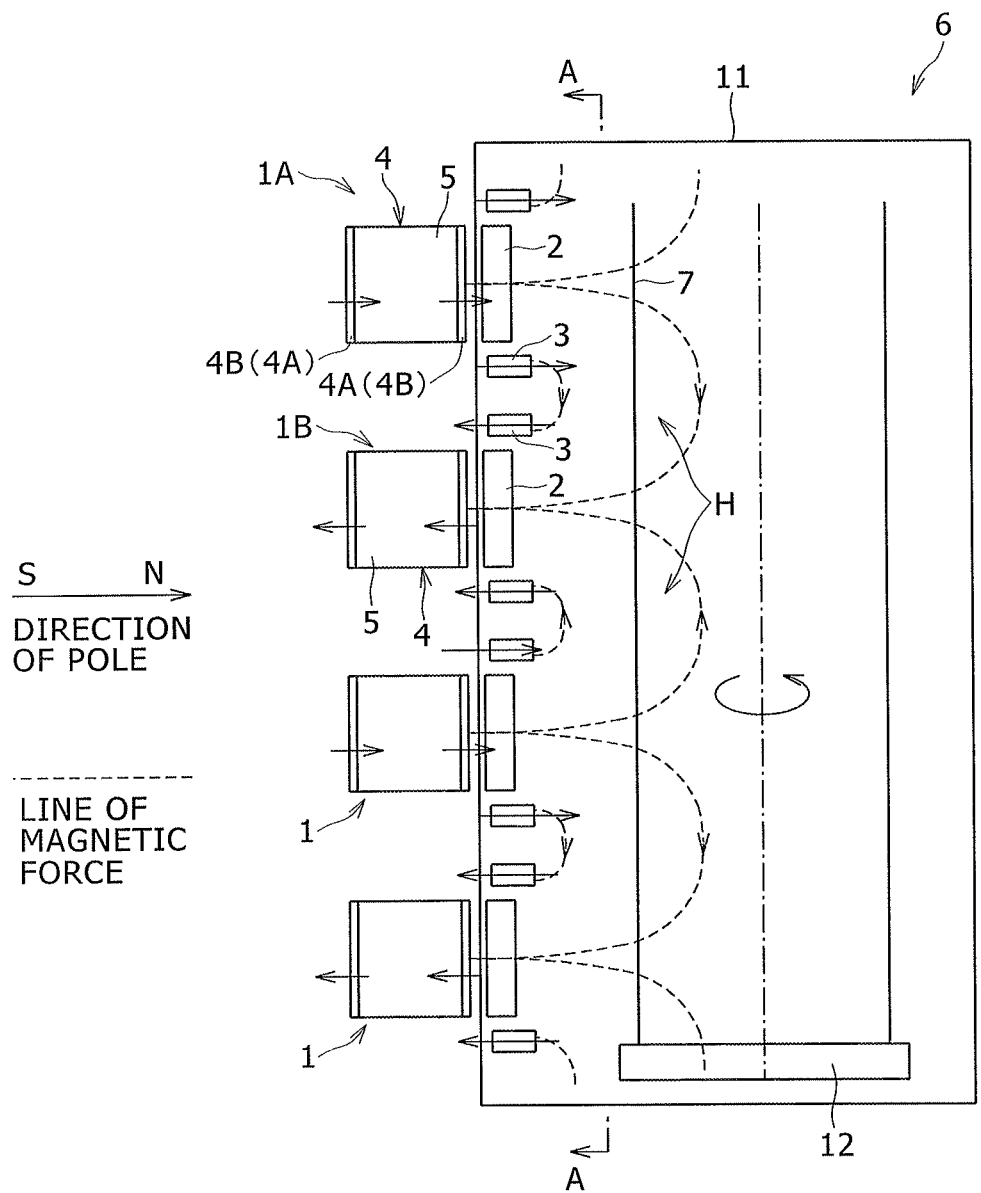
FIG. 9 is a side elevational view of a film formation apparatus of a second embodiment having a plurality of arc evaporation sources.

FIG. 9 and FIG. 10 show a film formation apparatus 6 according to the second embodiment having a plurality of the arc evaporation sources 1 described above.

The configuration of each of the arc evaporation sources 1 is substantially identical with that of the first embodiment.

The most prominent feature of the film formation apparatus 6 according to the second embodiment resides in the following points.

Specifically, in a film formation apparatus 6 according to the second embodiment as shown in FIG. 9, a plurality (four sets) of arc evaporation sources 1 are provided (preparatory step). Then, for the plurality of the arc evaporation sources 1, a plurality (four sets) of evaporation sources 1 are disposed being arranged vertically so as to connect lines of magnetic force of adjacent arc evaporation sources 1 to each other (arrangement step). Specifically, the plurality of the evaporation sources 1 are disposed linearly or non-linearly (refer to FIG. 10(a), (b)). Then, a coating film is formed by using the plurality of the arc evaporation sources 1 (coating film forming step).

In the same manner as the first embodiment, in each of the evaporation sources 1, other portions than the rear surface magnet 4 and the magnetic body 5 are disposed in the vacuum chamber 11.

As shown in FIG. 9, respective evaporation sources 1 are disposed such that the polarity (direction of pole) in the magnetic field forming means 8 (circumference magnet 3 and rear surface magnet 4) on the side near the substrate 7 are opposite between adjacent evaporation sources 1 to each other (opposite direction).

The opposite arrangement is, for example, the following arrangement. A certain evaporation source 1 is disposed such that lines of magnetic force are directed in the direction to the substrate 7 (direction approaching from the target 2 to the substrate 7). In this case, an evaporation source 1 adjacent to the certain evaporation source 1 is disposed such that the lines of magnetic force are directed opposing the substrate 7 (direction receding from the substrate 7 to the target 2).

By the arrangement described above, the lines of magnetic force formed by the certain evaporation source 1 and the lines of magnetic force formed by the evaporation source 1 adjacent to the certain evaporation source 1 are connected to each other.

For example, the N-pole of the magnetic field forming means 8 of the uppermost evaporation source 1A is directed to the surface of the target 2 (side near the substrate 7) and the S-pole of the magnetic field forming means 8 of the second uppermost evaporation source 1B is directed to the surface of the target 2. Accordingly, lines of magnetic force from the uppermost evaporation source 1A to the second uppermost evaporation source 1B are generated between the uppermost evaporation source 1A and the second uppermost evaporation source 1B adjacent to each other (refer to FIG. 9).

Accordingly, the lines of magnetic force between the uppermost evaporation source 1A and the second uppermost evaporation source 1B are in a closed state (closed region is referred to as "closed magnetic field region H"). Electrons emitted from the arc evaporation source 1 are trapped (confined) in the closed magnetic field region H. Thus, the emitted electrons are prevented from being drifted to the anode 17 or the vacuum chamber 11.

The closed magnetic field region H is not restricted to the combination of the evaporation source 1A and the evaporation source 1B but is formed between other evaporation sources 1 adjacent to each other.

Further, as described above, a great amount of lines of magnetic force extend in the direction from the arc evaporation source 1 to the substrate 7. Therefore, the closed magnetic field region H reaches to the vicinity of the substrate 7.

As a result, the concentration of the emitted electrons increases in each of the closed magnetic field regions H and collision between the reaction gas and the emitted electrons in the vacuum chamber 11 increases at the periphery of the substrate 7. Thus the reaction gas can be ionized at high efficiency.

Accordingly, by arranging the plurality of the arc evaporation sources 1 such that the lines of magnetic force of adjacent arc evaporation sources 1 are connected to each other, the film-forming speed is increased and the film can be formed further efficiently.

FIG. 10 is a frontal projection view (on the side near the substrate 7) of arc evaporation sources 1 arranged in plurality (views along an arrow A-A in FIG. 9). As shown in FIG. 10(a), a plurality of evaporation sources 1 can be arranged linearly in a vertical line. Further, as shown in FIG. 10(b) a plurality of evaporation sources 1 can be arranged non-linearly (for example, in a zigzag configuration).

When they are arranged linearly, the left-to-right width of the closed magnetic field region H is narrowed. This can further increase the concentration of emitted electrons in the closed magnetic field region H and films can be formed to the substrate 7 at higher efficiency in the closed magnetic field region H.

When they are arranged non-linearly, the width of the closed magnetic field region H is also increased by so much as a meandering width of the evaporation sources 1. Thus, even when the width of the substrate 7 is large, films can be formed efficiently within the closed magnetic field region H.

"Linear" arrangement includes not only the arrangement in one vertical row as described above but includes also an arrangement in one left-to-right row or arrangement in one oblique line in the inner surface of the vacuum chamber 11.

Further, the film formation apparatus 6 according to the second embodiment is configured such that the substrate 7 passes through the closed magnetic field region H described above. Specifically, in the film formation apparatus 6, a plurality of substrates 7 are provided in plurality (for example, by the number of two in symmetrical with respect to the rotational axis) on the rotary base 12 in the vacuum chamber 11. By the rotation of the rotary base 12, substrates 7 on the rotary base 12 move so as to pass in front of the evaporation source 1 (on the frontal side of the target 2) successively.

The configuration of passing the substrates 7 in the closed magnetic field region H is not restricted to the configuration of rotating the rotary base 12 or the substrate 7. For example, the evaporation source 1 may be configured to go around the substrate 7. That is, it may suffice that the film formation apparatus 6 has means of relatively moving the substrate 7 to the closed magnetic field H successively.

The film formation apparatus 6 according to the second embodiment may be in any other configuration. Further, the method for forming the film is identical with that in the first embodiment.

Third Embodiment

Figure 11:
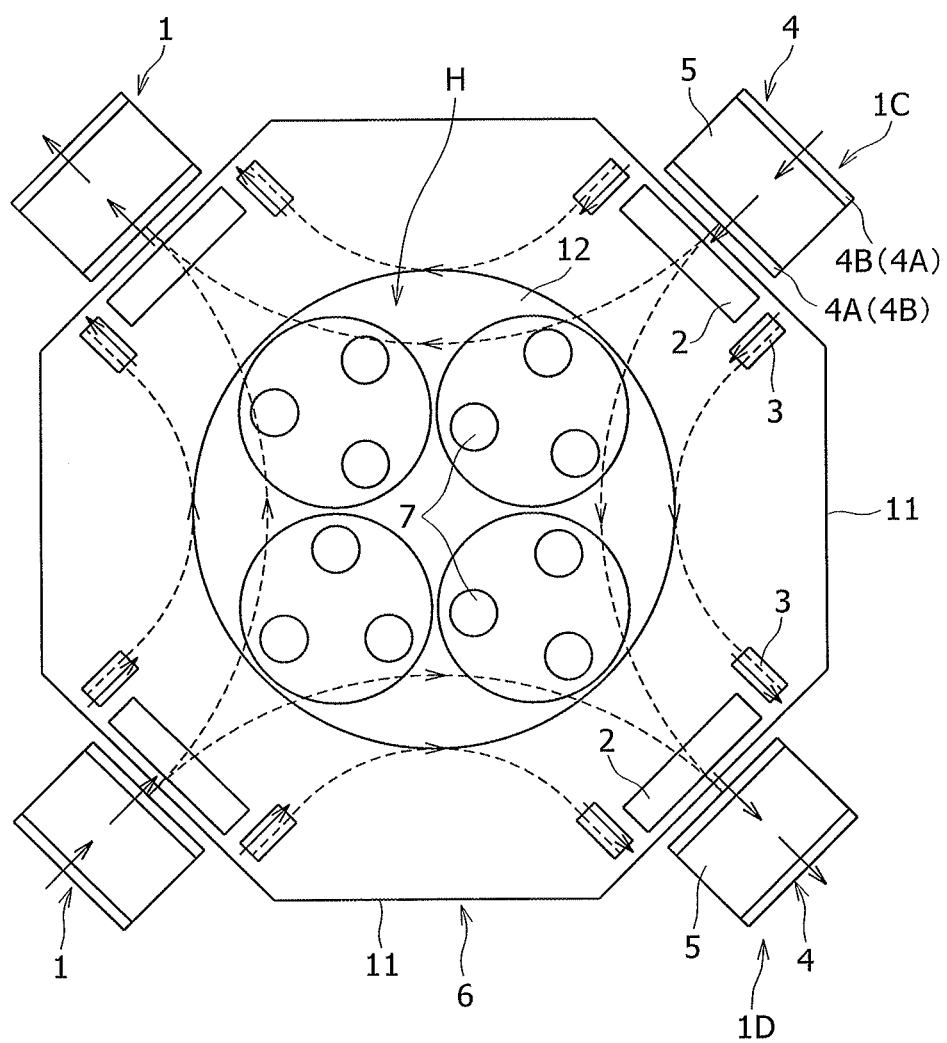
FIG. 11 is a plan view of a film formation apparatus of a third embodiment having a plurality of arc evaporation sources.

FIG. 11 shows a film formation apparatus 6 according to a third embodiment having a plurality of the evaporation sources 1 described above.

The third embodiment is different from the second embodiment in that a plurality (four sets) of evaporation sources 1 are arranged in a circular configuration (so as to surround the periphery of the substrates 7).

The evaporation sources 1 adjacent to each other on a circumference are disposed such that the lines of magnetic force formed by respective evaporation source 1 are connected to each other. Specifically, the direction of polarity (direction of pole) of magnetic field forming means 8 (circumference magnet 3, rear surface magnet 4, and magnetic body 5) of a certain evaporation source 1 is opposite to the direction of the polarity of the magnetic field forming means 8 of an evaporation source 1 adjacent to the certain evaporation source 1.

By the arrangement, the lines of magnetic force formed by the circumference magnet 3 and the rear surface magnet 4 are connected to each other by the arc evaporation sources 1 adjacent to each other.

For example, an N-pole of the magnetic field forming means 8 of an upper right evaporation source 1C in FIG. 11 is directed to the side of the surface of the target 2 (side near the substrate 7). An S pole of the magnetic field forming means 8 of the lower right evaporation source 1D of FIG. 11 is directed to the surface of the target 2. Accordingly, lines of magnetic force directing from the upper right evaporation source 1C to the lower right evaporation source 1D are generated.

As shown in FIG. 11, lines of magnetic force are connected also between other evaporation sources 1 adjacent to each other, other than the combination of the evaporation source 1C and the evaporation source 1D. Further, since the respective evaporation sources 1 are disposed circumferentially while surrounding the substrates 7, the lines of magnetic force from the respective sources are connected so as to surround the circumference of the substrates 7.

Accordingly, in the third embodiment, the lines of magnetic force extending from each of the evaporation sources 1 are in a closed state surrounding a region including the substrates 7. Then, a closed magnetic field region H is generated in a wide range surrounding the substrates 7.

Thus, electrons emitted from the evaporation sources 1 are trapped in a large closed magnetic field region H containing the substrates 7 and the concentration of the emitted electrons at the periphery of the substrates 7 is increased. Therefore, the film-forming speed can be improved, as well as films can be formed efficiently corresponding to the enlargement in the size and increase in the number of the substrates 7.

In the third embodiment, "linear" arrangement includes not only the arrangement in one vertical row but also the following arrangements. Specifically, an arrangement of disposing a plurality of evaporation sources 1 at a predetermined height and disposing, in this state, the plurality of the evaporation sources 1 circumferentially so as to surround the substrates 7 is included. Further, "non-linear" arrangement in the third embodiment includes not only a vertically zigzag arrangement as described in the second embodiment but includes the following arrangement. Specifically, an arrangement of disposing a plurality of evaporation sources 1 such that the height from the bottom of the vacuum chamber 11 is different and disposing, in this state, the plurality of evaporation sources 1 circumferentially so as to surround the substrates 7 is included. Also in this embodiment, other portions than the rear surface magnet 4 and the magnetic body 5 of the plurality of evaporation sources 1 are disposed in the vacuum chamber 11.

In addition, in the film formation apparatus 6 of the third embodiment, a plurality of substrates 7 are disposed (for example, by the number of two in symmetrical with respect to rotational axis) on a rotary base 12 in the vacuum chamber 11 such that the substrates 7 are situated in the wide closed magnet field region H as described above.

Accordingly, when the substrates 7 are rotated by the rotary base 12, the substrates 7 pass in front of each of the evaporation sources 1 successively. Therefore, films of identical or different composition and/or thickness can be formed successively over the substrates 7 by constituting the target 2 of each of the arc evaporation sources 1 with an identical or different material. As a result, when the material of the target 2 of each of the arc evaporation sources 1 is different, films of different materials can be formed in a multilayer.

The film formation apparatus 6 according to the third embodiment may be in other configuration. Further, the method for forming the film is identical with that of the first embodiment.

Fourth Embodiment

Figure 12:
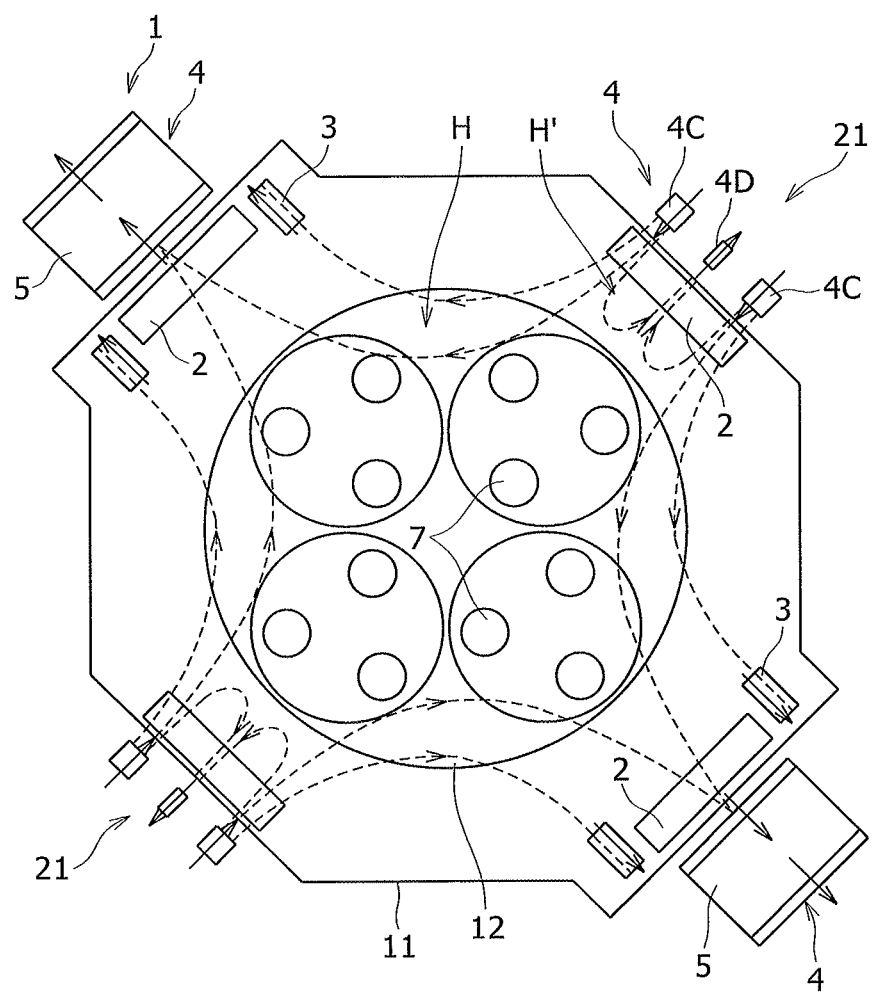
FIG. 12 is a plan view of a film formation apparatus of a fourth embodiment having arc evaporation sources and sputtering evaporation sources each in plurality.

FIG. 12 shows a film formation apparatus 6 according to a fourth embodiment having a plurality of the arc evaporation sources 1 described above, and a plurality of sputtering evaporation sources 21 respectively.

In the fourth embodiment, two opposing sets of the plurality of evaporation sources 1 in the third embodiment are replaced with sputtering evaporation sources 21. Then, each of the evaporation sources 1, 21 are disposed circumferentially.

Specifically, as shown in FIG. 12, in the film formation apparatus 6 according to the fourth embodiment, a plurality of evaporation sources 1 and 21 including two sets of arc evaporation sources 1 and two sets of sputtering evaporation sources 21 are provided (preparatory step). Then, the plurality of the evaporation sources 1 and 21 are disposed circumferentially such that lines of magnetic force of the adjacent evaporation sources 1 and 21 are connected to each other (arrangement step). Then, a film is formed by using the plurality of evaporation sources 1 and 21 (film forming step).

The sputtering evaporation source 21 is a general sputtering evaporation source. Specifically, in the sputtering evaporation source 21, an inert gas (for example, argon (Ar), neon (Ne), or xenon (Xe)) introduced to the vacuum chamber 11 is ionized into plasmas by electric discharge and the plasma ions are caused to collide against (sputtered) the target 2 thereby flicking the target material to the substrate 7.

The magnetic field forming means 8 in the sputtering evaporation source 21 includes, as the rear surface magnet 4 of the target 2, a ring shaped magnet 4C (ring shaped permanent magnet) and a columnar magnet 4D (columnar permanent magnet) disposed inside the ring shaped magnet 4C and coaxially therewith.

As shown in FIG. 12, the ring shaped magnet 4C and the columnar magnet 4D are disposed such that the direction of the polarity of the ring shaped magnet 4C and the direction of the polarity of the columnar magnet 4D (direction of the pole) oppose to each other.

By the arrangement, lines of magnetic force are connected so as to surround the surface side of the target 2 between the ring shaped magnet 4C and the columnar magnet 4D to form a closed state near the surface of the target 2 (the closed region is referred to as "plasma closed magnetic field region H'").

Accordingly, electrons emitted from the sputtering evaporation source 21 are confined in the plasma closed magnetic field region H'. Thus, the concentration of the inert gas plasmas in the plasma closed magnetic field region H' is increased and more plasma ions collide against the target 2. Therefore, the film-forming efficiency can be improved.

Further, the adjacent evaporation sources 1 and 21 are disposed as below. Specifically, the polarity of the ring shaped magnet 4C of the sputtering evaporation source 21 and the direction of the pole of the magnetic field forming means 8 (circumference magnet 3 and rear surface magnet 4) of the arc evaporation source 1 adjacent to the sputtering evaporation source 21 are opposite to each other.

Accordingly, the lines of magnetic force formed by the ring shaped magnet 4C of the sputtering evaporation source 21 and the magnetic field forming means 8 of the arc evaporation source 1 are connected to each other between the evaporation sources 1 and 21 adjacent to each other.

As a result, the lines of magnetic force are connected so as to surround the circumference of the substrates 7 between each of the arc evaporation sources 1 and each of the sputtering evaporation sources 21. Thus, a closed magnetic field region H is generated separately from the plasma closed magnetic field region H' described above. The closed magnetic field region H is generated in a wide range surrounding the substrates 7.

As a result, the concentration of the emitted electrons at the periphery of the substrates 7 can be increased in the closed magnetic field region while keeping a high plasma concentration near the sputtering evaporation source 21. Thus, a coating film can be formed on large size and large amount of the substrate simultaneously and at a high film-forming speed.

Then, a method for forming a film using the film formation apparatus 6 of the fourth embodiment is to be described.

When a film is formed by using only the arc evaporation source 1, a reaction gas such as nitrogen ($N_2$), methane ($CH_4$), and acetylene ($C_2H_2$) is introduced into the vacuum chamber 11 or film formation is performed under a pressure of several Pa (about 1 to 7 Pa).

On the other hand, when a film is formed by using only the sputtering evaporation source 21, an inert gas such as argon (Ar) is introduced into the vacuum chamber 11 and film formation is performed under a pressure of about several 0.1 Pa.

Further, when a film is formed by using the arc evaporation source 1 and the sputtering evaporation source 21 simultaneously, a reaction gas such as nitrogen and an inert gas such as argon are used in admixture. The total pressure of the mixed atmosphere is set to about 2 to 4 Pa, and film is formed at a pressure lower than that in the film formation using only the arc evaporation source 1. The partial pressure of the reaction gas (nitrogen, etc.) is set to 0.5 to 2.65 Pa.

As described above, even when two kinds of evaporation sources 1 and 21 are used simultaneously, the closed magnetic field region H and the plasma closed magnetic field region H' are separated by the lines of magnetic force respectively. Thus, the concentration of plasmas and the concentration of emitted electrons can be increased independently. Accordingly, the film-forming efficiency by the arc evaporation source 1 and the film-forming efficiency due to the sputtering evaporation source 21 can be improved simultaneously.

In the film formation apparatus 6 of the fourth embodiment, other configurations such as arrangement of the rotary base 12 and the substrates 7 are identical with those of the first embodiment and the third embodiment.

By the way, the present invention is not restricted to each of the embodiments and the examples described above, and can be modified appropriately within a range of the invention shown in the scope of the claim for patent.

The target 2 may be in any other shape than the disk shape.

Specifically, the shape of the projected plane of the target 2 may be a figure of a rotational symmetric body (square, hexagonal, etc.). In this case, the circumference magnet 3, the rear surface magnet 4, and the magnetic body 5 may not be disposed coaxially relative to the target 2. However, the circumference magnet 3, the rear surface magnet 4, and the magnetic body 5 are preferably disposed such that the central axis thereof (the rotational axis of the circumference magnet 3, the rear surface magnet 4, and the magnetic body 5 when they are rotational symmetric body) passes the target 2.

Further, the target 2 may be of a figure where the shape of the projected plane has a longitudinal direction (elliptic, rectangular, etc.). When the shape of the projected plane of the target 2 is elliptic, the diameter can be read as a major diameter or a minor diameter. Further, when the shape of the projected plane of the target 2 is rectangular, the diameter can be read as a longer side or a shorter side.

Any circumference magnet 3 that surrounds the circumference of the target 2 may be used. Specifically, a ring shaped permanent magnet having a shape of the projected plane that can surround the shape of the projected plane of the target 2 can be adopted. For example, when the shape of the projected plane of the target 2 is elliptic, a permanent magnet having an elliptic shape of the projected plane that can surround the target can be used.

Further, a circumference magnet 3 having the following shape may be used so long as it can surround the target 2. Specifically, the circumference magnet 3 may be of a point symmetrical figure (square, hexagonal, etc.) or a figure having a longitudinal direction (elliptic, rectangular, etc.) corresponding to the shape of the projected plane of the target 2.

The rear surface magnet 4 may be of any other shape than the disk-shape. For example, the shape of the projected plane of the rear surface magnet 4 may be a point symmetric figure (square, hexagonal, etc.) or a figure having a longitudinal direction (elliptic, rectangular, etc.).

In the same manner, the magnetic body 5 may be in any other shape than the disk shaped. Specifically, the shape of the projected plane of the magnetic body 5 may be a point symmetric figure (square, hexagonal, etc.) or a figure having a longitudinal direction (elliptic, rectangular, etc.)

The shape of projected plane of the rear surface magnet 4 and the magnetic body 5 is preferably similar to the shape of the projected plane of the target 2.

Further, the circumference magnet 3, the rear surface magnet 4, and the magnetic body 5 may be disposed each in plurality.

The evaporation source used for the film formation apparatus 6 is not restricted to the arc evaporation source 1 or the sputtering evaporation source 21 but may be a plasma beam evaporation source or an ohmic heating evaporation source.

The specific embodiments described above mainly include the invention having the following configuration.

The present invention provides an arc evaporation source of generating arc discharge to the surface of a target thereby melting the target including, at least one circumference magnet disposed so as to surround the circumference of the target and such that the direction of magnetization thereof is in perpendicular to the surface of the target, a non-ring shaped first permanent magnet disposed on the side of the rear surface of the target, having a polarity in the same direction as the polarity of the circumference magnet, and disposed such that the direction of magnetization thereof is in perpendicular to the surface of the target, a non-ring shaped second permanent magnet disposed between the first permanent magnet and the target or on the side of the rear surface of the first permanent magnet in a state of leaving a gap to the first permanent magnet, having a polarity in the same direction as the polarity of the circumference magnet, and disposed such that the direction of magnetization thereof is in perpendicular to the surface of the target, and a magnetic body disposed between the first permanent magnet and the second permanent magnet.

In the arc evaporation source according to the invention, the circumference magnet is disposed to the circumference of the target, and magnets having the polarity in the same direction as the circumference magnet (first permanent magnet and the second permanent magnet) are disposed on the rear surface side of the target. Thus, a magnetic field of a large horizontal component is formed on the surface of the target (target evaporation surface), and repulsive magnetic fields are formed by both of the magnets on the surface of the target (both of the magnets of the circumference magnet, and the first permanent magnet and the second permanent magnet). With the configuration of the magnet described above, rotation of the arc is made faster and generation of macro particles is reduced. Accordingly, a smooth film can be formed. The circumference magnet is disposed in order to surround the circumference of the target so that the horizontal component of the magnetic fields to be formed on the surface of the target is increased.

In the invention, a non-ring shaped permanent magnet having a polarity in the same direction as the polarity of the circumference magnet and disposed at the rear surface of the target (first permanent magnet) is provided. Then, a great amount of lines of magnetic force at high progression property extending from the central portion of the surface of the target to the substrate are generated. In this embodiment, the direction of the magnetic pole of the first permanent magnet is made identical with the direction of the pole of the circumference magnet, and the shape of the first permanent magnet is formed as the non-ring shaped, in order to generate a great amount of lines of magnetic force at high straightness extending from the central portion at the surface (end face) of the target to the direction of the substrate. In this way, by generating a great amount of lines of magnetic force extending from the central portion of the surface of the target to the substrates, the particles evaporated and ionized from the target can be transported efficiently to the coating substrate. Therefore, the film-forming speed is improved.

Assuming that if the pole of the circumference magnet and the pole of the first permanent magnet are in opposite directions, lines of magnetic force generated from the central portion of the surface (end face) of the target are drawn into the circumference magnet. Accordingly, the lines of magnetic force extending in the direction of the substrate cannot be generated.

Further, even when the pole of the circumference magnet and the magnet of the first permanent magnet are made in an identical direction, if the shape of the rear surface magnet is not solid (ring shape), lines of magnetic force are not generated from the central portion of the magnet. Accordingly, the lines of magnetic force extending from the central portion of the surface of the target to the direction of the substrates cannot be generated. Further, out of the range of the configuration of the present invention, since the lines of magnetic force extending from the central portion of the surface of the target to the direction of the substrate cannot be generated, the effect of improving the film-forming speed cannot be obtained.

Further, in the invention, in addition to the first permanent magnet described above, another permanent magnet (second permanent magnet) is disposed while leaving a gap relative to the first permanent magnet. This can improve the straightness of the lines of magnetic force generated from the central portion of the surface of the target.

The first permanent magnet and the second permanent magnet are disposed at a gap as described above, in order to improve the degree of the straightness of the lines of magnetic force extending from the central portion of the surface of the target to the direction of the substrate. By the improvement in the degree of the straightness, of the lines of magnetic force, since particles evaporated and ionized from the target can be transported efficiently to the coating substrate, the film-forming speed is improved.

On the other hand, if the first permanent magnet and the second permanent magnet are disposed in close adhesion to each other, since the degree of the straightness is not improved, the effect of improving the film-forming speed cannot be obtained.

The most prominent feature of the invention is that a magnetic body is disposed between the first permanent magnet and the second permanent magnet. This can increase the number of lines of magnetic force at higher degree of straightness that are generated from the central portion of the surface of the target. That is, when the magnetic body is disposed between the first permanent magnet and the second permanent magnet, the lines of magnetic force extending from the surfaces (end faces) opposing to each other of each of the permanent magnets can be connected with no leakage and the number of lines of magnetic force at high straightness generated from the central portion of the surface of the target is further increased.

During arc discharge, electrons move while coiling around the lines of magnetic force, whereas particles evaporated and ionized from the target move while being attracted to the electrons. In view of the above, by increasing the number of lines of magnetic force of high straightness, particles vaporized and ionized from the target can be transported efficiently to the coating substrate. Accordingly, the film-forming speed is further improved.

In the present invention "ring shaped permanent magnet" means not only the single permanent magnet having a ring shaped but also means a plurality of permanent magnets arranged in a ring shape. Further, "ring shape" is not restricted to a true circle but also includes an elliptic or polygonal shape.

In the arc evaporator, both end faces of the magnetic body are preferably adhered closely to the end face of the first permanent magnet and the end face of the second permanent magnet respectively.

According to the embodiment, the lines of magnetic force extending from the end faces of the first permanent magnet and the second permanent magnet opposing to each other can be connected with no leakage.

In the arc evaporator, it is preferred that the target is disk shaped and the circumference magnet is a ring shaped permanent magnet.

According to this embodiment, since the direction of the lines of magnetic force ahead of the surface of the target can be directed to the substrate, the particles evaporated and ionized from the target can be transported efficiently to the coating substrate. Accordingly, the film-forming speed is improved.

In the arc evaporator, the shape of the plane formed by projecting the first permanent magnet and the second permanent magnet in the direction perpendicular to the surface thereof is preferably similar to the shape of the plane formed by projecting the target in the direction perpendicular to the surface thereof.

In this embodiment, the projected shapes of the first permanent magnet and the second permanent magnet are similar to the projected shape of the target. Thus, the lines of magnetic force extending from the first permanent magnet and the second permanent magnet to the target can be guided with no leakage to the target.

Further, the invention provides a method for manufacturing a coating film including a film forming step of forming a film by using the arc evaporation source.

According to the manufacturing method of the invention, a coating film is formed by using the arc evaporation source in which a magnetic body is disposed between the first permanent magnet and the second permanent magnet. This can form a coating film in a state where a great amount of lines of magnetic force at high straightness is generated from the central portion of the surface of the target. During arc discharge, electrons move while coiling around the lines of magnetic force and, at the same time, particles evaporated and ionized from the target move while being attracted to the electrons. Accordingly, particles evaporated and ionized from the target can be transported efficiently to the coating substrate by forming a coating film in a state of generating a great amount of lines of magnetic force at high straightness as described above. Accordingly, the film-forming speed can be improved.

In the method for manufacturing the coating film, it is preferred to further include a preparatory step of providing a plurality of arc evaporation sources and an arrangement step of disposing the plurality of the arc evaporation sources so that the lines of magnetic force of the adjacent arc evaporation sources are connected to each other.

Further, in the method for manufacturing the coating film, it is preferred to further include a preparatory step of providing plural kinds of evaporation sources including the arc evaporation source, and an arrangement step of disposing the plural kinds of evaporation sources such that the lines of magnetic force of adjacent evaporation sources are connected to each other.

In the embodiments, a plurality of evaporation sources are disposed such that the lines of magnetic force of the adjacent evaporation sources are connected to each other. This provides a state in which the lines of magnetic force between adjacent evaporation sources are closed, and electrons emitted from the arc evaporation source can be confined within the closed region of the lines of magnetic force. As a result, the colliding probability of the electrons emitted from the arc evaporation source is increased to cause ionization of a reaction gas at high probability. Accordingly, the film-forming speed can be improved further by each of the embodiments described above.

Specifically, in the arrangement step, the plural kinds of arc evaporation sources can be disposed linearly or non-linearly.

In the same manner, in the arrangement step, the plural kinds of arc evaporation sources can be disposed linearly or non-linearly.

Further, the present invention provides a film formation apparatus comprising the arc evaporation source and an arc power source that applies a voltage to the arc evaporation source for generating arc discharge.

The film formation apparatus according to the invention comprises an arc evaporation source in which a magnetic body is disposed between the first permanent magnet and the second permanent magnet, and an arc power source for applying a voltage to the arc evaporation source. This can generate a great amount of lines of magnetic force at high straightness from the central portion of the surface of the target. During the arc discharge, electrons move while coiling around the lines of magnetic force and, at the same time, particles evaporated and ionized from the target move while being attracted to the electrons. Accordingly, particles evaporated and ionized from the target can be transported efficiently to the coating substrate by generating a great amount of the lines of magnetic force at high straightness as described above. Accordingly, the film-forming step can be improved.

In the film formation apparatus, it is preferred to include the arc evaporation sources in plurality, in which the plurality of the arc evaporation sources are disposed such that the lines of magnetic force of the adjacent arc evaporation sources are connected to each other.

Further, in the film formation apparatus, it is preferred to further include plural kinds of evaporation sources including the arc evaporation source in which the plural kinds of evaporation sources are disposed such that the lines of magnetic force of adjacent evaporation sources are connected to each other.

In the embodiments described above, the plurality of evaporation sources are disposed such that the lines of magnetic force of adjacent evaporation sources are connected to each other. This provides a state where the lines of magnetic force between the adjacent evaporation sources are closed, and electrons emitted from the arc evaporation source can be confined within the closed region of the lines of magnetic force. As a result, the colliding probability of the electrons emitted from the arc evaporation source is increased and ionization of the reaction gas can be generated at high probability. Accordingly, the film-forming speed can be improved further according to each of the embodiments.

Specifically, the plurality of the arc evaporation sources can be disposed linearly or non-linearly.

In the same manner, the plural kinds of the evaporation sources can be disposed linearly or non-linearly.

INDUSTRIAL APPLICABILITY

The present inventions can be utilized as an arc evaporation source of a film formation apparatus for forming a thin film.

LIST OF REFERENCE SIGNS

H closed magnetic field region
1 arc evaporation source
2 target
3 circumference magnet
4A disk shaped rear surface magnet (first permanent magnet)
4B disk shaped rear surface magnet (second permanent magnet)
5 magnetic body
6 film formation apparatus
7 substrate
15 arc power source
21 sputtering evaporation source
A arrow showing lines of magnetic force on the side nearest to the axis of a target in Comparative Example 1
B arrow showing lines of magnetic force on the side nearest to the axis of a target in Comparative Example 2
C arrow showing lines of magnetic force on the side nearest to the axis of a target in Comparative Example 3
D arrow showing lines of magnetic force on the side nearest to the axis of a target in Comparative Example 4
E arrow showing lines of magnetic force on the side nearest to the axis of a target in Example 1 and Example 2
A' arrow showing a line of magnetic force most remote from the axis of a target in Comparative Example 1
B' arrow showing a line of magnetic force most remote from the axis of a target in Comparative Example 2
C' arrow showing a line of magnetic force most remote from the axis of a target in Comparative Example 3
D' arrow showing a line of magnetic force most remote from the axis of a target in Comparative Example 4
E' arrow showing a line of magnetic force most remote from the axis of a target in Example 1 and Example 2

The invention claimed is:

1. An arc evaporation source of generating arc discharge to the surface of a target, the target having a centerpoint, thereby melting the target comprising:

at least one circumference magnet disposed so as to surround the circumference of the target and such that the direction of magnetization thereof is in perpendicular to the surface of the target;

a non-ring shaped first permanent magnet disposed on the side of the rear surface of the target, having at least a portion which is positioned on a line extending perpendicularly from said centerpoint of the target, having a polarity in the same direction as the polarity of the circumference magnet, and such that the direction of magnetization thereof is in perpendicular to the surface of the target;

a non-ring shaped second permanent magnet disposed between the first permanent magnet and the target or on the side of the rear surface of the first permanent magnet so as to leave a gap between the first permanent magnet and the target, having a polarity in the same direction as the polarity of the circumference magnet, and such that the direction of magnetization thereof is in perpendicular to the surface of the target; and a magnetic body disposed between the first permanent magnet and the second permanent magnet.

2. An arc evaporation source according to claim 1, wherein both end faces of the magnetic body are in close contact with the end face of the first permanent magnet and the end face of the second permanent magnet respectively.

3. An arc evaporation source according to claim 1, wherein the target is disk shaped, and
the circumference magnet is a ring shaped permanent magnet.

4. An arc evaporation source according to claim 1, wherein the shape of a plane formed by projecting the first permanent magnet and the second permanent magnet in the direction perpendicular to the surface thereof is similar to the shape of a plane formed by projecting the target in the direction perpendicular to the surface thereof.

5. A method for manufacturing a coating film including a coating film forming step of forming the coating film by using an arc evaporation source according to claim 1.

6. A method for manufacturing a coating film according to claim 5 further comprising:
a preparatory step of providing a plurality of arc evaporation sources; and
an arrangement step of disposing the plurality of the arc evaporation sources such that lines of magnetic force of adjacent arc evaporation sources are connected to each other.

7. A method for manufacturing a coating film according to claim 6, wherein the plurality of the arc evaporation sources are disposed linearly or non-linearly in the arrangement step.

8. A method for manufacturing a coating film according to claim 5 further comprising:
a preparatory step of providing plural kinds of the evaporation sources including the arc evaporation source; and
an arrangement step of disposing the plurality kinds of the evaporation sources such that the lines of magnetic force of adjacent evaporation sources are connected to each other.

9. A method for manufacturing a coating film according to claim 8, wherein the plurality kinds of evaporation sources are linearly or non-linearly disposed in the arrangement step.

10. A film formation apparatus including the arc evaporation source according to claim 1, and
an arc power source that applies a voltage to the arc evaporation source for generating arc discharge.

11. A film formation apparatus according to claim 10, wherein a plurality of the arc evaporation sources are disposed such that lines of magnetic force of adjacent arc evaporation sources are connected to each other.

12. A film formation apparatus according to claim 11, wherein
the plurality of the arc evaporation sources are disposed linearly or non-linearly.

13. A film formation apparatus according to claim 12 wherein:
a plurality of evaporation sources each including the arc evaporation source are further provided where at least one of the plurality of evaporation sources is different from another one of the plurality of evaporation sources in configuration, and
the plurality of the evaporation sources are disposed such that lines of magnetic force of adjacent evaporation sources are connected to each other.

14. A film formation apparatus according to claim 13, wherein the plurality of the evaporation sources are disposed linearly or non-linearly.

15. A method for manufacturing a coating film including a coating film forming step of forming the coating film by using an arc evaporation source according to claim 2.

16. A method for manufacturing a coating film including a coating film forming step of forming the coating film by using an arc evaporation source according to claim 3.

17. A method for manufacturing a coating film including a coating film forming step of forming the coating film by using an arc evaporation source according to claim 4.

18. A film formation apparatus including the arc evaporation source according to claim 2, and
an arc power source that applies a voltage to the arc evaporation source for generating arc discharge.

19. A film formation apparatus including the arc evaporation source according to claim 3, and
an arc power source that applies a voltage to the arc evaporation source for generating arc discharge.

20. A film formation apparatus including the arc evaporation source according to claim 4, and
an arc power source that applies a voltage to the arc evaporation source for generating arc discharge.

* * * * *